United States Patent

[11] 3,615,457

[72] Inventors Michael Seibert
Philadelphia, Pa.;
Lawrence G. Vaughan, Wilmington, Del.
[21] Appl. No. 822,793
[22] Filed Apr. 2, 1969
[45] Patented Oct. 26, 1971
[73] Assignee E. I. du Pont de Nemours and Company
Wilmington, Del.

[54] PHOTOPOLYMERIZABLE COMPOSITIONS AND PROCESSES OF APPLYING THE SAME

16 Claims, No Drawings

[52] U.S. Cl. .......... 96/35.1, 96/115
[51] Int. Cl. .......... G03c 5/00, G03c 1/68
[50] Field of Search .......... 96/115, 115 P, 35.1; 204/159.24

[56] References Cited

UNITED STATES PATENTS

| | | | |
|---|---|---|---|
| 2,842,457 | 7/1958 | Morgan | 117/46 |
| 2,738,319 | 3/1956 | Kern | 96/115 P |
| 2,994,614 | 8/1961 | Fitch | 106/1 |

*Primary Examiner*—Norman G. Torchin
*Assistant Examiner*—Edward C. Kimlin
*Attorney*—John J. Klocko, III

ABSTRACT: The photopolymerizable compositions contain organic noble metal compounds, photopolymerizable monomers, organic sensitizers, organosulfur compounds and, optionally, a flux. The process comprises applying these novel compositions to ceramic substrates and exposing the films to ultraviolet energy of the proper wavelength through negative masks. This causes the exposed portions of the film to harden, and thereafter, the unhardened portions of the films are removed with a suitable solvent. Then the entire ceramic assembly is fired to produce fine line noble metal patterns having high resolution.

PHOTOPOLYMERIZABLE COMPOSITIONS AND PROCESSES OF APPLYING THE SAME

BACKGROUND OF THE INVENTION

It is known to apply metal patterns to a support by first coating the surface of the support with a uniform layer of the relevant metal, whereupon a resist is photographically applied, the excess metal then being etched away. The application of such as resist is effected by means of a soluble composition consisting of polymerizable substance which becomes insoluble by exposure. The nonexposed parts of the metal layer on a support with this composition are treated with a solvent, as a result of which these parts become accessible to an etching agent, while the metal pattern to be produced is screened from attack by the then insoluble composition present thereon. It is also known to harden the insoluble composition completely by heating as a result of which the resistance to etching agents is further increased.

The methods in which use is made of etching leave much to be desired. It is comparatively difficult to remove the resist after the metal has been etched away; as a rule, solvents for this purpose do not exist but for certain cases there are liquids which give rise to swelling of the hardened resist, as a result of which the adherence is reduced and the layer can be scratched away. When use is made of ceramic supports, which are always slightly porous and readily hold adsorbed residual etching agents, the risk of corrosion is great. Furthermore, fine line patterns having high resolution have generally not been attainable by prior processes.

Thus, there is a need in the art to provide better compositions and processes for applying same in the production of metal patterns. In particular, there is need for compositions and methods of forming conductive, solderable, and/or resistive patterns on ceramic substrates with high resolving power.

SUMMARY OF THE INVENTION

This invention relates to photopolymerizable compositions for the production of high resolution noble metal patterns comprising an organic solvent and organic solids, wherein the solids comprise:

a. 5–85 percent, by weight, of an organic noble metal compound;

b. 5–30 percent, by weight, of a photopolymerizable polyfunctional aliphatic compound having a molecular weight below 2500;

c. 0.5–10 percent, by weight, of an organic sensitizer;

d. 0–60 percent, by weight, of organosulfur compound(s); and e. 0–50 percent, by weight, of a flux.

The process of this invention comprises:

1. applying the photopolymerizable composition described above onto an inorganic dielectric substrate to form a film, and drying the film;

2. placing a negative mask having a desired pattern over the film;

3. exposing the masked film to ultraviolet light for a sufficient period of time to harden a desired pattern on the film;

4. developing the desired pattern by contacting a suitable solvent with the film whereby the undesired, unhardened portions of the film are washed away; and 5. drying the developed pattern and firing the coated substrate at a temperature within the range of 700° C.–1000° C.

DESCRIPTION OF THE PREFERRED EMBODIMENTS

The photopolymerizable compositions of this invention comprise five kinds of ingredients. The first ingredient is an organic noble metal compound which comprises from 5–85 percent by weight of the solids content of the polymerizable composition; a preferred range is 10–50 percent. The organic noble metal compound map be any of the well-known compounds, used in decorating compositions (e.g. liquid bright gold) or in electronic metallizing compositions. These include noble metal resinates, noble metal cyclic terpene mercaptides, noble metal tertiary mercaptides, etc. Some of the more common noble metal organic compounds have been described in U.S. Pat. Nos. 2,490,399; 2,994,614 and 3,268,568. Specific exemplary compounds include the pinene mercaptides of platinum, palladium, gold, silver, ruthenium, rhodium, osmium and iridium. Many noble metal compounds containing at least one carbon-metal bond of various types, such as those discussed in "Organometallic Compounds," Vol. II, Coates, Green and Wade, Methuen & Co., Ltd. London (1968), can also be used. Mixed compounds of noble metals may also be utilized.

Component (b) of the photopolymerizable composition comprises a polyfunctional aliphatic compound having a molecular weight below 2500. The compound is present in amounts ranging from 5–30 percent; a preferred range is 10–25 percent. The compound is necessary so that it can be polymerize by chain extension when exposed to a sensitizer and ultraviolet light. There must be a substantial amount of polyfunctional, reactive groups to form a hardened product which is not removed by a solvent. Typical monomers which can be used are trimethylol ethane trimethacrylate, ethylene glycol dimethacrylate, triethylene glycol dimethacrylate, ethylene diacrylate and mixtures thereof. It should be noted that small amounts of polymers having molecular weights greater than 2500 may also be present initially. However, it is necessary to start with substantial amounts (greater than 50 percent) of polyfunctional compound so that polymeric formation and chain extension occurs in situ.

Component (c) of the composition is a sensitizer. The sensitizer absorbs energy from the ultraviolet light and catalyzes and/or enters into the polymerization reaction. This invention is not to be based upon any particular theory, and the exact function of the sensitizer is not fully understood. However, sensitizers are well known in the art and are discussed in "Radical Polymerization," J. C. Bevington, Academic Press, N.Y., (1961), pages 26–28. Typical sensitizers include tertiary butyl anthraquinone, benzoin methyl ether and mixtures thereof. The amount of sensitizer may range from 0.5–10 percent while a preferred range is from 1–5 percent. An organosulfur compound (d) is desirable for increasing adhesion and smoothness of the metal film. Generally, from 1–60 percent by weight of an organosulfur compound is required with a preferred range being 2–10 percent. Some sulfur may be provided by component (a) of the photopolymerizable composition, but this is usually not a sufficient amount and therefor, an additional organosulfur compound is required. In particular, organosulfur compounds from the group consisting of sulfurized terpenes, thipenes, or mercaptides with boiling points in excess of 220° C. are preferred. The well-known sulfurized damar resin has been very effectively utilized.

The fifth component (e), a flux, is optional; it may be present in amounts ranging from 0.50 percent by weight; a preferred range is 5–40 percent. The particular flux used is largely a matter of choice and depends somewhat upon the type of ceramic material to be coated. A number of fluxing materials which will enhance conductivity, adhesion, and brilliance of the metallic films are known in the art. For example, salt and resinates of bismuth, cadmium, lead, copper, cobalt, antimony, uranium, iridium, rhodium, vanadium, chromium and tin may be used for these purposes. Any of the fluxes heretofore used in the art to promote proper appearance and adherence, many of which are commercially available, may be used to likewise promote appearance and adherence. Generally, it is most desirable that the flux be soluble in the solvent system. A number of fluxes are usually needed in combination with each other to produce the most satisfactory results in the ultimate fired metallic films.

The particular solvent or mixture of solvents used for the solids of the photopolymerizable compositions is a matter of choice depending upon the method of application used, for example, whether the composition is to be applied by a stamping operation, by a painting operation, or by means of a squeegee through a screen. The different solvents used will impart to the composition differences in interfacial tension, surface tension, evaporation rate, viscosity, etc. As a consequence, different solvents and mixtures of solvents which impart specific application characteristics to the gold decorating compositions may be used for any particular purpose. Furthermore, different solvents and mixtures of solvents are recommended for different methods of application. Typical solvents usable in this invention, alone or as mixtures, include: methyl ethyl ketone, cyclohexanone, ethyl acetate, amyl acetate, Cellosolve, butanol, nitrobenzene, benzene, toluene, xylene, petroleum ether, chloroform, carbon tetrachloride, trichloroethylene, perchloroethylene, various terpenes, such as pinene, dipentene, dipentene oxide, and the like, essential oils, such as oils of lavendar, rosemary, aniseed, sassafras, wintergreen, fennel and turpentine, various rosins and balsams, and synthetic resins.

The photopolymerizable composition is formulated by dissolving the solids in a suitable solvent. This may require various heating and/or stirring procedures which are well known in the art. After the composition is prepared, it can be applied to a suitable inorganic dielectric substrate. Any of the well known dielectric substrates may be used, including alumina, glass, barium titanate, sapphire, berylia, steatite, fosterite and zircon. For example, a drop of the solution may be placed on a ceramic substrate and spun by centrifugal force out towards the periphery of the substrate. The composition forms an even, smooth film by this process. The spinning may be accomplished by mounted the ceramic chip on a vacuum spindle which rotates at 500–5000 r.p.m. depending upon the thickness desired. The film is dried and then placed in a vacuum or inert gas frame (argon or nitrogen) in close contact with a negative mask having the desired pattern. Photographic film masks are preferred over metal or photographic emulsion on glass because of contact and internal reflection problems.

The next step involves exposing the mask substrate to 200–1,500 watts of ultraviolet light for times of from a few seconds to several hours at a distance of about ten inches. A suitable source of ultraviolet light is a high pressure mercury arc. It is necessary to cool the substrate by air streams or circulating water because the heat generated will cause sticking of the metallic film to the mask and have adverse hardening effects on the metallic film.

After exposure, the metallic film is developed applying suitable solvent to wash away the undeveloped, unpolymerized, unhardened portions of the metallic film. This can be done by immersion, spraying, brushing or any of the well-known techniques. Suitable solvents for this purpose include carbon tetrachloride, chloroform, isobutyl alcohol, trichloroethylene, perchloroethylene and tetrachloroethylene.

The developed image is dried by blowing with a stream of air as quickly as possible after development. Then the substrate is fired to produce the metallic film and cause it to adhere firmly to the substrate. The typical procedure is to bring the temperature of the substrate from room temperature to peak temperature (e.g., 800° C.) in 45 minutes; the peak temperature is held for three minutes and the substrate is then removed and cooled for five minutes. Good ventilation to remove the organic decomposition products is necessary.

The finished circuit consists (if it is a conductor pattern) of precious metal films, specularly reflecting light, with resistivities of 0.1–10 ohms/square and of a thickness ranging from 0.05–5 microns. The adherent films may be solderable, thermal compression bondable or ultrasonic bondable.

Resistors can also be made from these photopolymer compositions. For example, resinates of palladium and silver can be used as the organic noble metal compounds. By varying the ratio of palladium and silver, the resistances may also be tailor-made to vary from 100–10,000 ohms/square.

The invention is illustrated by the following examples. In the examples and elsewhere in the specification, all parts, ratios and percentages of materials or components are by weight.

Various photopolymerizable compositions were prepared by dissolving the solid constituents in a suitable solvent in varying proportions as set forth in table I. The dissolving step was carried out under a dim amber light while the mixture was stirred with a magnetic stirrer for several hours without external heating.

Several drops of the photopolymerizable composition were placed in the center of a glazed alumina chip (1''×1''×20 mils thick). The chip was spun at 1,000 r.p.m. for one second to distribute the composition evenly over the ceramic surface. The chip was held in the center of a vacuum chuck and air dried for ten minutes. A negative film mask having a fine line pattern was placed in firm contact with the coated chip in a vacuum frame with a polyethylene terephthalate face plate. A vacuum held the assembly in close registry and excluded oxygen. The chip was then exposed to intense ultraviolet light from a 1,200 watt, high-pressure mercury arc source at a distance of ten inches for 20 minutes. The vacuum frame rested on a cooling device with circulating water as the cooling medium. The substrate was removed from the vacuum frame and developed by spraying the surface with carbon tetrachloride at the rate of 40 lbs./square inch pressure for 30 seconds. When development was complete, the carbon tetrachloride was allowed to evaporate. The chips was then heated from 20° C. to 800° C. in about 45 minutes to burn out the organics and deposit the metals in an adherent, coherent, electrically conductive film.

The resolution of the fine line conductor pattern was rated. An "excellent" (EX) rating was given if one mil lines with one mil separation were clearly resolved; a "good" rating was given if two mil lines with two mil separation were clearly resolved, a "poor" rating was given if two mil lines with two mil separation were not clearly resolved.

The adhesion was rated as "excellent" if no metal was removed after five vigorous rubs with a pencil eraser; a "-good" rating was assigned if some metal was removed; a "-poor" rating was given if most or all of the metal was removed.

In order to test the solderability, the coated chips were immersed in a Sn/Pb solder (60–40) at 215° C. for 2 seconds. The coating of solder was deposited on the metallized portions of the chip. The solderability was deemed to be excellent if the metal pattern was uniformily covered with solder and if the adhesion of the solder was greater than 25 lbs./in. (using a tinned copper strip); a "good" rating was assigned if the adhesion was 10–25 lbs./in.; a "poor" rating was given if the solder failed to adhere to the metal pattern or if adhesion was less than 10 lbs/in. The results are reported in table I.

We claim:

1. A photopolymerizable composition for the production of high resolution noble metal patterns comprising an organic solvent and organic solids, wherein the solids comprise:

a. 5–85 percent, by weight, of an organic noble metal compound;

b. 5–30 percent, by weight, of a photopolymerizable polyfunctional aliphatic compound having a molecular weight below 2500;

c. 0.5–10 percent, by weight, of an organic sensitizer;

d. 0–60 percent, by weight, of organosulfur compound (s); and e. 0–50 percent, by weight, or a flux.

2. A photopolymerizable composition for the production of high resolution noble metal patterns comprising an organic solvent and organic solids, wherein the solids comprise:

a. 10–50 percent, by weight, of an organic noble metal compound;

b. 10–25 percent, by weight, of a photopolymerizable polyfunctional aliphatic compound having a molecular weight below 2500;

c. 1–5 percent, by weight, of an organic sensitizer;

d. 2–10 percent, by weight, of organosulfur compound(s); and e. 5–40 percent, by weight, of a flux.

3. A composition in accordance with claim 2 wherein the organic noble metal compound consists essentially of 25–35

TABLE I
[Weight percent]

| Example | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| Pinene mercaptide Pt (31.5% Pt) | | | | 29.94 | 33.33 | 31.55 | 31.55 | 31.55 | 31.54 | 33.27 | 27.91 | 31.42 | 13.9 | 7.4 |
| Pinene mercaptide Au (43.5% Au) | 74.64 | 67.36 | 71.34 | 37.41 | 41.72 | 39.59 | 39.59 | 39.59 | 39.59 | 41.63 | 35.00 | 39.42 | 42.0 | 22.2 |
| Pinene mercaptide Pd (25% Pd) | | | | | | | | | | | | | | |
| Pinene mercaptide Ag (40% Ag) | | | | | | | | | | | | | | |
| Trimethylol ethane trimethacrylate | | | | | | 15.05 | | | | | | | | |
| Ethylene glycol dimethacrylate | 15.05 | 18.91 | 15.05 | 18.92 | 11.25 | | 15.05 | | | | | | | |
| Triethylene glycol dimethacrylate | | | | | | | | 15.05 | 16.29 | 10.61 | 21.66 | 14.16 | 7.13 | 14.5 |
| Triethylene glycol diacetate | | | | | | | | | | 0.82 | 1.67 | 1.23 | 0.53 | 1.2 |
| Polymethyl methacrylate | | | | | | | | | | | | | 7.83 | 11.6 |
| Tertiary butyl anthraquinone | 2.47 | 3.12 | 2.47 | 3.12 | 1.84 | 2.47 | 2.47 | 2.47 | 1.24 | 1.83 | 3.75 | 2.46 | 2.71 | 2.5 |
| Benzoin methyl ether | | | | | | | | | | | | | | |
| Sulfurized damar resin | 3.30 | 3.12 | 3.30 | 3.12 | 3.47 | 3.30 | 3.30 | 3.30 | 3.30 | 3.47 | 2.92 | 3.29 | 6.4 | 33.9 |
| Diphenyl sulfoxide | | | | | | | | | | | | | | |
| Rhodium resinate (3% Rh) | 3.30 | 3.12 | 3.30 | 3.12 | 3.48 | 3.30 | 3.30 | 3.30 | 3.30 | 3.47 | 2.92 | 3.29 | 5.2 | 0.1 |
| Bismuth resinate (5% Bi) | | 3.12 | 3.30 | 3.12 | 3.48 | 3.30 | 3.30 | 3.30 | 3.30 | 3.47 | 2.92 | 3.29 | 12.5 | 2.1 |
| Vanadium resinate (6% V) | 1.24 | 1.25 | 1.24 | 1.25 | 1.43 | 1.44 | 1.44 | 1.44 | 1.44 | 1.43 | 1.25 | 1.44 | 1.8 | 4.5 |
| Total solids | 48.5 | 48.1 | 48.5 | 48.1 | 48.5 | 48.5 | 48.5 | 48.5 | 48.5 | 49 | 48.0 | 48.7 | 43.9 | 50 |
| Trichlorethylene | 51.5 | 51.9 | 51.5 | 51.9 | 51.5 | 51.5 | 51.5 | 51.5 | 51.5 | 51 | 52.0 | 51.3 | 56.1 | 50 |
| Benzene | | | | | | | | | | | | | | |
| Resolution | Ex. | Ex. | Ex. | Ex. | Ex. | Ex. | Ex. | Ex. | Poor | Poor | Poor | Ex. | Ex. | Good |
| Adhesion | Ex. | Good | Good | Good | Poor | Good | Good | Good | Good | Good | Ex. | Good | Poor | Good |
| Resistance (ohms/square) | 0.13 | 0.3 | 0.2 | 1.0 | 3.8 | 3.0 | 6.5 | 2.0 | 3.0 | 5.0 | 2.9 | 1.1 | 2.5 | 33.0 |
| Solderability | Poor | Poor | Poor | Poor | Poor | Good | Good | Ex. | Good | Good | Ex. | Ex. | Poor | Good |

| Example | 15 | 16 | 17 | 18 | 19 | 20 | 21 | 22 | 23 | 24 | 25 | 26 | 27 |
|---|---|---|---|---|---|---|---|---|---|---|---|---|---|
| Pinene mercaptide Pt (31.5% Pt) | 5.9 | 12.1 | | 5.7 | | | | 71.34 | | | | | |
| Pinene mercaptide Au (43.5% Au) | 17.7 | 36.4 | 29.7 | 17.1 | 75.88 | 75.88 | | | 77.94 | | 21.88 | 74.64 | 79.18 |
| Pinene mercaptide Pd (25% Pd) | | | | | | | 65.23 | | | | 43.10 | | |
| Pinene mercaptide Ag (40% Ag) | | | | | | | | | | 74.64 | | | |
| Trimethylol ethane trimethacrylate | | | | | | | | | | | | | |
| Ethylene glycol dimethacrylate | | | | | 15.05 | 15.05 | 20.98 | 15.05 | 15.05 | 15.05 | 24.59 | 15.05 | 15.05 |
| Triethylene glycol dimethacrylate | 5.9 | 12.1 | 14.5 | 5.7 | | | | | | | | | |
| Triethylene glycol diacetate | 1.1 | 2.2 | 1.2 | 1.0 | | | | | | | | | |
| Polymethyl methacrylate | 10.4 | 21.3 | 11.6 | 10.0 | | | | | | | | | |
| Tertiary butyl anthraquinone | 1.1 | 2.2 | 2.5 | 1.0 | 2.47 | | 3.45 | 2.47 | 2.47 | 2.47 | 4.04 | 2.47 | 2.47 |
| Benzoin methyl ether | | | | | | 2.47 | | | | | | | |
| Sulfurized damar resin | 52.6 | 2.7 | 33.8 | 26.0 | 3.30 | 3.30 | 2.87 | 3.30 | | 3.30 | 2.69 | | 3.30 |
| Diphenyl sulfoxide | | | | | | | | | | | | 3.30 | |
| Rhodium resinate (3% Rh) | 0.1 | 0.2 | 0.1 | 0.08 | 3.30 | 3.30 | 3.16 | 3.30 | 3.30 | 3.30 | 2.69 | 3.30 | |
| Bismuth resinate (5% Bi) | 1.7 | 3.5 | 2.1 | 1.6 | | | 3.16 | 3.30 | | | | | |
| Vanadium resinate (6% V) | 3.5 | 7.3 | 4.5 | 31.82 | | | 1.15 | 1.24 | 1.24 | 1.24 | 1.01 | 1.24 | |
| Total solids | 50 | 70 | 50 | 50 | 48.5 | 48.5 | 34.8 | 48.5 | 48.5 | 48.5 | 29.7 | 48.5 | 48.5 |
| Trichlorethylene | 50 | 30 | 50 | 50 | 51.5 | 51.5 | 11.5 | 51.5 | 51.5 | 51.5 | 70.3 | 51.5 | 51.5 |
| Benzene | | | | | | | 53.7 | | | | | | |
| Resolution | Good | Poor | Good | Good | Good | Good | Poor | Good | Poor | Good | Poor | Poor | Good |
| Adhesion | Good | Poor | Poor | Poor | Poor | Poor | Poor | Poor | Poor | Good | Poor | Good | Good |
| Resistance (ohms/square) | 24.0 | 1.9 | 120.0 | 2500 | 0.7 | 0.97 | 4800 | 36.0 | 1.4 | 30.0 | 21.9 | 0.44 | 0.3 |
| Solderability | Good | Good | Poor | Poor | Poor | Poor | Poor | Ex. | Poor | Poor | Poor | Poor | Poor |

percent pinene mercaptide platinum and 55–80 percent pinene mercaptide gold.

4. A composition in accordance with claim 2 wherein the photopolymerizable monomer is selected from the group consisting of trimethylolethane trimethacrylate, ethylene glycol dimethacrylate, triethylene glycol dimethacrylate, ethylene diacrylate and mixtures thereof.

5. A composition in accordance with claim 2 wherein the organic sensitizer is selected from the group consisting of tertiary butyl anthraquinone, benzoin methyl ether and mixtures thereof.

6. A composition in accordance with claim 2 wherein organosulfur compound is sulfurized damar resin.

7. A composition in accordance with claim 2 wherein the flux is selected from the group consisting of rhodium resinate, bismuth resinate, vanadium resinate and mixtures thereof.

8. An inorganic dielectric substrate having the composition of claim 1 coated thereon.

9. An inorganic dielectric substrate having the composition of claim 2 coated thereon.

10. A process for producing noble metal patterns on inorganic dielectric substrates comprising:

1. applying the photopolymerizable composition of claim 1 onto an inorganic dielectric substrate to form a film and drying the film;
2. placing a negative mask having a desired pattern over the film;
3. exposing the masked film to ultraviolet light for a sufficient period of time to harden a desired pattern on the film;
4. developing the desired pattern by contacting a suitable solvent with the film whereby the undesired, unhardened portions of the film are washed away; and
5. drying the developed pattern and firing the coated substrate at a temperature within the range of 700° C.–1000° C.

11. A process for producing noble metal patterns on inorganic dielectric substrates comprising:

1. applying the photopolymerizable composition of claim 2 onto an inorganic dielectric substrate to form a film and drying the film;
2. placing a negative mask having a desired pattern over the film;
3. exposing the masked film to ultraviolet light for a sufficient period of time to harden a desired pattern on the film;
4. developing the desired pattern by contacting a suitable solvent with the film whereby the undesired, unhardened portions of the film are washed away; and
5. drying the developed pattern and firing the coated substrate at a temperature within the range of 700° C.–1000° C.

12. A process in accordance with claim 10 wherein the inorganic dielectric substrate is a glazed alumina substrate.

13. A process in accordance with claim 10 wherein the ultraviolet light intensity is within the range of 200–1500 watts.

14. A process in accordance with claim 10 wherein the solvent utilized in step 4 is carbon tetrachloride.

15. A process in accordance with claim 10 wherein the thickness of the film is within the range of 0.05–5 microns.

16. A process in accordance with claim 10 wherein the firing step is carried out for 45 minutes at a peak temperature of 800° C.

* * * * *